United States Patent
Palaniswamy et al.

(10) Patent No.: US 9,698,563 B2
(45) Date of Patent: Jul. 4, 2017

(54) FLEXIBLE LED DEVICE AND METHOD OF MAKING

(75) Inventors: Ravi Palaniswamy, Singapore (SG); Arokiaraj Jesudoss, Singapore (SG); Alejandro Aldrin Il Agcaoili Narag, Singapore (SG); James R. White, Singapore (SG); Fong Liang Tan, Singapore (SG); Andrew J. Ouderkirk, St. Paul, MN (US); Justine A. Mooney, Austin, TX (US); Nathan P. Kreutter, Austin, TX (US); Qihong Nie, Woodbury, MN (US); Jian Xia Gao, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 487 days.

(21) Appl. No.: 13/883,354

(22) PCT Filed: Oct. 27, 2011

(86) PCT No.: PCT/US2011/057980
§ 371 (c)(1),
(2), (4) Date: Jul. 19, 2013

(87) PCT Pub. No.: WO2012/061184
PCT Pub. Date: May 10, 2012

(65) Prior Publication Data
US 2013/0294471 A1    Nov. 7, 2013

Related U.S. Application Data

(60) Provisional application No. 61/444,370, filed on Feb. 18, 2011, provisional application No. 61/409,796, (Continued)

(51) Int. Cl.
*H01L 29/22* (2006.01)
*H01S 5/024* (2006.01)
(Continued)

(52) U.S. Cl.
CPC .............. *H01S 5/024* (2013.01); *H01L 24/32* (2013.01); *H01L 33/486* (2013.01); *H01L 33/64* (2013.01);
(Continued)

(58) Field of Classification Search
CPC ....... H01L 33/486; H01L 33/62; H01L 33/64; H01L 33/647
(Continued)

(56) References Cited

U.S. PATENT DOCUMENTS

| 4,994,938 A | 2/1991 | Baudouin |
| 5,994,648 A | 11/1999 | Glovatsky et al. |

(Continued)

FOREIGN PATENT DOCUMENTS

| CN | 1825640 | 8/2006 |
| EP | 0338641 | 10/1989 |

(Continued)

OTHER PUBLICATIONS

"Flexible PCB with LED Assembly on heatsink", Alliance Flex Tech, Irvine, CA, [retrieved from the Internet on Jul. 11, 2012], URL: <http://allianceflextech.com/products_detail.php?ProID=3&product=Flexible+PCB+with+LED+Assembly+on+heatsink>.

(Continued)

*Primary Examiner* — Matthew E Warren
(74) *Attorney, Agent, or Firm* — Clifton F. Richardson; Melanie G. Gover

(57) ABSTRACT

Provided is a flexible light emitting semiconductor device, such as an LED device, that includes a flexible dielectric layer having first and second major surfaces with a conductive layer on the first major surface and at least one cavity in the first major surface with a conductive layer in the cavity that supports a light emitting semiconductor device.

(Continued)

The conductive layer in the cavity is electrically isolated from the second major surface of the dielectric layer.

18 Claims, 11 Drawing Sheets

Related U.S. Application Data filed on Nov. 3, 2010, provisional application No. 61/524,649, filed on Aug. 17, 2011.

(51) Int. Cl.
*H01L 33/64* (2010.01)
*H01L 33/48* (2010.01)
*H05K 1/18* (2006.01)
*H01L 23/00* (2006.01)

(52) U.S. Cl.
CPC ........... *H01L 33/647* (2013.01); *H05K 1/183* (2013.01); *H05K 1/189* (2013.01); *H01L 2224/32225* (2013.01); *H01L 2224/45144* (2013.01); *H01L 2224/48091* (2013.01); *H01L 2224/48137* (2013.01); *H01L 2224/48227* (2013.01); *H01L 2224/73265* (2013.01); *H01L 2924/01029* (2013.01); *H01L 2924/01322* (2013.01); *H01L 2924/01327* (2013.01); *H01L 2924/07802* (2013.01); *H01L 2924/12032* (2013.01); *H01L 2924/12041* (2013.01); *H01L 2924/12042* (2013.01); *H01L 2924/15747* (2013.01); *H01L 2924/15787* (2013.01); *H01L 2924/181* (2013.01); *H01L 2924/3011* (2013.01); *H01L 2924/351* (2013.01); *H05K 2201/10106* (2013.01)

(58) Field of Classification Search
USPC .... 257/98–100, E33.056–E33.059, E33.062, 257/E33.064
See application file for complete search history.

(56) References Cited

U.S. PATENT DOCUMENTS

| | | | |
|---|---|---|---|
| 6,153,928 A | 11/2000 | Cho | |
| 6,320,753 B1 | 11/2001 | Launay | |
| 6,331,063 B1 | 12/2001 | Kamada et al. | |
| 6,412,971 B1 | 7/2002 | Wojnarowski | |
| 6,531,328 B1 | 3/2003 | Chen | |
| 6,614,103 B1 | 9/2003 | Durocher et al. | |
| 6,853,010 B2 | 2/2005 | Slater, Jr. | |
| 6,936,855 B1 | 8/2005 | Harrah | |
| 7,012,017 B2 | 3/2006 | Brunner | |
| 7,192,795 B2 | 3/2007 | Boardman | |
| 7,199,400 B2 | 4/2007 | Sasuga | |
| 7,348,045 B2 | 3/2008 | Yang | |
| 7,572,031 B2 | 8/2009 | Schultz | |
| 7,745,832 B2 * | 6/2010 | Hsieh et al. | 257/79 |
| 7,800,121 B2 | 9/2010 | Aanegola et al. | |
| 7,871,836 B2 | 1/2011 | Yang | |
| 7,963,674 B2 | 6/2011 | Takekuma | |
| 8,053,800 B2 * | 11/2011 | Horio | H01L 31/167 250/221 |
| 8,101,966 B2 | 1/2012 | Yen | |
| 8,384,121 B2 | 2/2013 | Tischler et al. | |
| 2002/0163006 A1 | 11/2002 | Yoganandan et al. | |
| 2003/0039106 A1 | 2/2003 | Koyanagi | |
| 2003/0072153 A1 | 4/2003 | Matsui | |
| 2003/0189830 A1 * | 10/2003 | Sugimoto et al. | 362/294 |
| 2005/0247944 A1 | 11/2005 | Haque | |
| 2006/0087866 A1 | 4/2006 | Ng | |
| 2006/0171152 A1 | 8/2006 | Suehiro | |
| 2007/0007558 A1 | 1/2007 | Mazzochette | |
| 2007/0029569 A1 | 2/2007 | Andrews | |
| 2007/0096272 A1 | 5/2007 | Wang | |
| 2007/0120089 A1 | 5/2007 | Mao | |
| 2007/0194336 A1 * | 8/2007 | Shin et al. | 257/98 |
| 2007/0246717 A1 | 10/2007 | Ng | |
| 2007/0253209 A1 | 11/2007 | Loh et al. | |
| 2007/0291503 A1 | 12/2007 | Friedrich | |
| 2007/0292609 A1 | 12/2007 | Speer | |
| 2008/0057333 A1 | 3/2008 | Chu et al. | |
| 2008/0067526 A1 | 3/2008 | Chew | |
| 2008/0079017 A1 | 4/2008 | Loh | |
| 2008/0101071 A1 | 5/2008 | Imai | |
| 2008/0107863 A1 | 5/2008 | Ikeda et al. | |
| 2008/0315239 A1 | 12/2008 | Lin | |
| 2009/0115926 A1 | 5/2009 | Lim | |
| 2009/0121249 A1 | 5/2009 | Tseng et al. | |
| 2009/0290273 A1 * | 11/2009 | Shih | H01L 25/167 361/56 |
| 2010/0079989 A1 | 4/2010 | Yeh | |
| 2010/0096746 A1 | 4/2010 | Tseng | |
| 2010/0133557 A1 * | 6/2010 | Kwon | H01L 31/024 257/88 |
| 2010/0155696 A1 | 6/2010 | Duan | |
| 2010/0165601 A1 | 7/2010 | Yoon et al. | |
| 2010/0277907 A1 | 11/2010 | Phipps | |
| 2011/0003437 A1 | 1/2011 | Lin | |
| 2011/0006318 A1 * | 1/2011 | Chung | 257/91 |
| 2011/0007509 A1 | 1/2011 | Hayes | |
| 2011/0031509 A1 | 2/2011 | Kirihara | |
| 2011/0095315 A1 | 4/2011 | Park | |
| 2011/0284914 A1 * | 11/2011 | Suzuki | H05K 1/0204 257/99 |
| 2012/0002420 A1 | 1/2012 | Imai et al. | |
| 2014/0036461 A1 | 2/2014 | Palaniswamy et al. | |

FOREIGN PATENT DOCUMENTS

| | | |
|---|---|---|
| EP | 1744376 | 1/2007 |
| EP | 2287931 | 2/2011 |
| JP | 3535602 | 10/1996 |
| JP | 2010/251376 | 11/2010 |
| WO | WO 2007/002644 | 1/2007 |
| WO | WO 2007/089599 | 8/2007 |

OTHER PUBLICATIONS

"SEM of Chip in Etched Pocket (Example of placing an IC into a polycarbonate pocket)", photo by John W. Benedict, 3M ESD Laboratory, Jun. 2005.

"Thermal Management of Golden Dragon LED", Application Note, OSRAM Opto Semiconductors, Apr. 2006.

Ascari et al., "A miniaturized and flexible optoelectronic sensing system for tactile skin", Journal of Micromechanics and Microengineering 17 (2007) 2288-2298.

Bailey et al., "Packaging of LED Backlights for Ruggedised Displays", 2010 International Symposium on Advanced Packaging Materials: Microtech, pp. 98-101.

Huang, "Applying surface-mounted LED's in automotive interior and exterior lighting", OSRAM Opto Semiconductors, Proc. SPIE, vol. 4648, p. 148-155.

Kim et al., "Optimization of Flexible Substrate for COF (Chip on Flexible) LED Packaging", 2009 Electronic Components and Technology Conference, May 26-29, 2009, pp. 1953-1960.

Lee, "Thermo-Mechanical Properties of High-Performance Thermal Interface Gap Filler Pads", Parker Hannifin, Chomerics Division.

Nadarajah et al., "Flexible Inorganic Nanowire Light-Emitting Diode", Nano Lett., vol. 8, No. 2, 2008, pp. 534-537.

Yum et al., "Y3Al5O12:Ce0.05 Phosphor Coatings on a Flexible Substrate", Colloids and Surfaces A: Physicochem Eng. Aspects, 251 (2004), pp. 203-207.

* cited by examiner

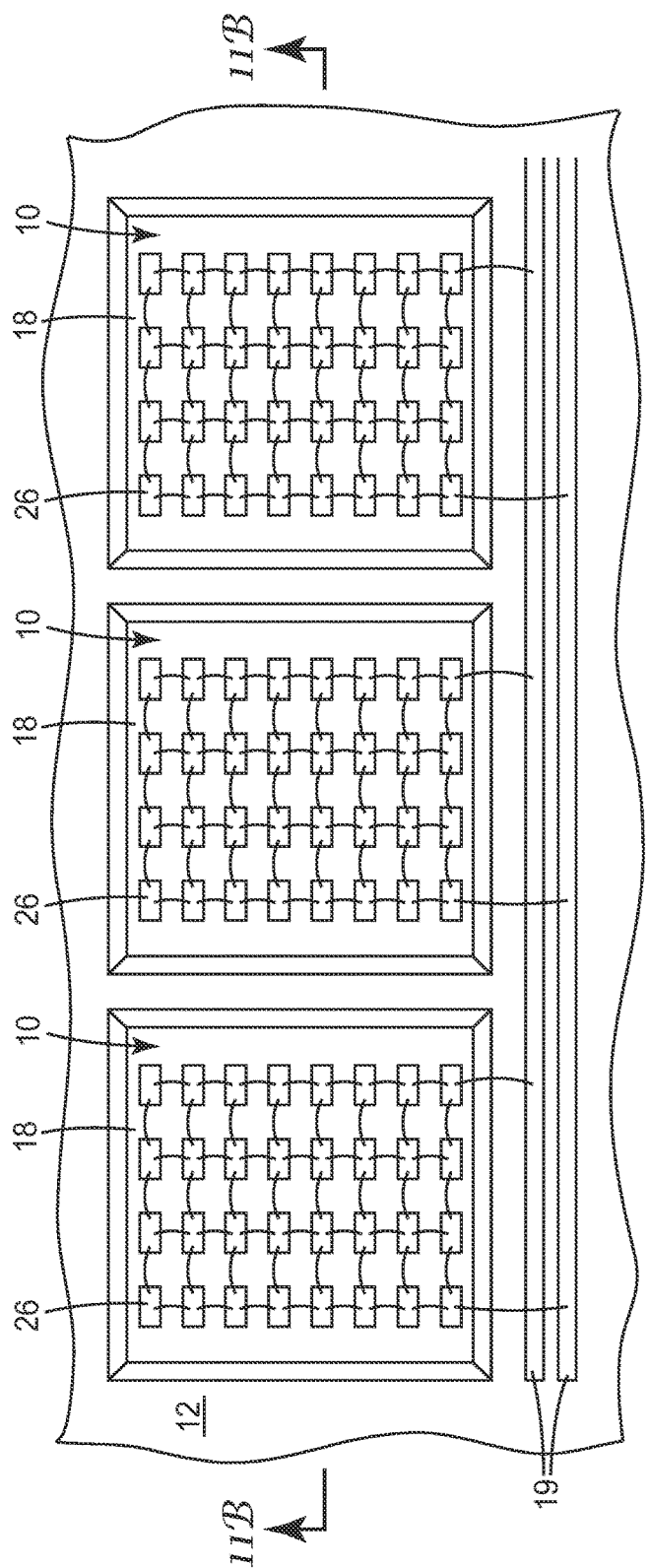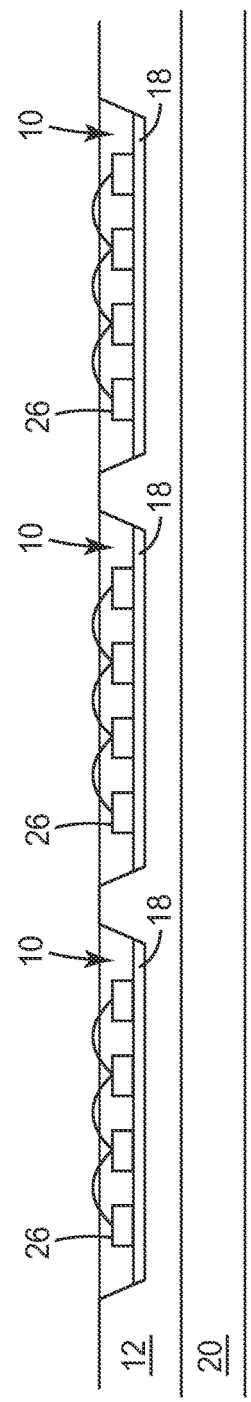
FIG. 11A
FIG. 11B

FLEXIBLE LED DEVICE AND METHOD OF MAKING

TECHNICAL FIELD

This invention relates to flexible high power light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by a buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

SUMMARY

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs on one side of a dielectric layer are positioned near a thermally conductive layer or material on the opposite side of the dielectric layer by controlling the thickness of the dielectric layer between the LESD and the thermally conductive layer. In at least one embodiment of the present invention, an area of thinned dielectric layer is achieved by controlled removal, e.g., by etching, an area of the dielectric layer to a desired thickness. Etching the dielectric layer may provide additional advantages by creating slanted side walls which can be coated with a reflecting material to provide enhanced light efficiency. Additionally, in at least some embodiments, because the LESD sits below the surface of the dielectric layer, it has a lower profile than standard LES devices, which makes it well-suited for low form factor applications.

At least one aspect of the present invention features an article comprising a flexible polymeric dielectric layer having first and second major surfaces, the first surface having a first conductive layer thereon and having at least one cavity therein, the second major surface optionally having a second conductive layer thereon, the at least one cavity having a third conductive layer on at least a portion of its walls and floor; the third conductive layer configured to directly or indirectly support a light emitting semiconductor device, wherein the first conductive layer is electrically conductive and the second and third conductive layers are thermally conductive, and wherein there is no direct connection between the second major surface of the dielectric layer and the third conductive layer.

As used in this application:

"LES" means light emitting semiconductor(s), including light emitting diodes and laser diodes, and "LESD" means light emitting semiconductor devices, including light emitting diode device(s) and laser diode device(s). An LESD may be a bare LES die construction; a complete packaged LES construction; or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction.

An advantage of at least one embodiment of the present invention is:

The flexible LES devices can provide excellent heat dissipation, which is needed for high power LESDs.

The flexible LES devices can be wired as an array on a single flexible insulating substrate.

The wall slopes of the cavities in which the LESDs are located can help to reflect light emitted by the LESDs, which results in better light management.

The resulting flexible LES devices can be bent in simple or compound curves.

The use of a flexible substrate with LESDs can eliminate the cost associated with conventional submounts.

The above summary of the present invention is not intended to describe each disclosed embodiment or every implementation of the present invention. The Figures and detailed description that follow below more particularly exemplify illustrative embodiments.

BRIEF DESCRIPTION OF DRAWINGS

FIGS. 11A and 11B depict a top and cross sectional view of an embodiment of a flexible LESD of the present invention.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front," "back," "above," "below," etc., is used with reference to the orientation of the Figure(s) being described. Because components of embodiments can be positioned in a number of different orientations, the directional terminology is used for purposes of illustration and is in no way limiting. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate.

Figure 1:
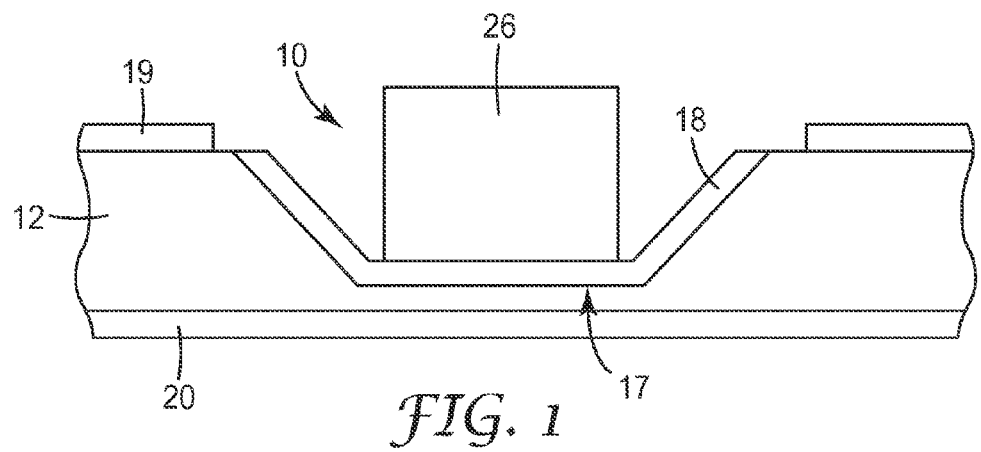
FIG. 1 depicts an embodiment of a flexible LESD of the present invention.

At least one embodiment of the present invention is illustrated in FIG. 1, which shows a flexible dielectric layer 12 having at least one indentation or cavity 10 in which is located an LESD 26. Cavity 10 is initially defined by walls and floor 17, but may be further defined by layers and coatings applied to its walls and floor 17. (Although the plural term "cavity walls" is used herein, this term also refers to a single continuous curved wall such as those with a conical or frustoconical shape.) Cavity 10 may be any suitable shape, e.g., circular, oval, rectangular, serpentine, a channel, a grid (e.g., forming islands of dielectric layer separated by a continuous pattern of overlapping channels), etc. A cavity may contain a single LESD 26 or may contain multiple LESDs. For example, if the cavity is channel-shaped, grid-shaped, or large, multiple LESDs may be located in a single cavity. Floor 17 is formed by a portion of dielectric layer 12. In this embodiment, the walls and floor of cavity 10 support conductive layer 18. In other embodiments, conductive layer 18 may support additional materials such as additional conductive materials and/or additional layers such as a reflective coating. Conductive layer 18 is preferably thermally conductive and, in some embodiments, also electrically conductive. Conductive layer 19 is located on the top surface of dielectric layer 12 and conductive layer 20 is located on the bottom surface of dielectric layer 12. Conductive layer 19 is typically electrically conductive and optionally thermally conductive. In some embodiments, conductive layer 19 comprises an electrically conductive circuit. LESD 26 may be wire bonded to such electrically conductive circuit. Conductive layer 18 directly or indirectly supports LESD 26 in cavity 10. In some embodiments, a passivation or bonding layer is located beneath LESD 26 to facilitate bonding LESD 26 to an underlying layer. In some embodiments, conductive layer 18 may comprise a portion of conductive layer 19 that is located in cavity 10 or may comprise a separate conductive layer that is deposited on the walls and floor of cavity 10.

Conductive layer 18 is typically thermally conductive, and in some embodiments, also electrically conductive. Conductive layer 18 typically has a relatively uniform thickness and generally follows the contours of an underlying surface. Additional conductive matter forming conductive material 18' (see, e.g., FIG. 4) may optionally be deposited over conductive layer 18 in the cavity, for example, if conductive layer 18 is less than the desired thickness within cavity 10. Conductive layer 18 and conductive material 18' may comprise the same or different matter. For example, both might be copper, or conductive layer 18 might be copper while conductive material 18' might be solder. If conductive layer 18 and conductive material 18' comprise the same matter, the interface between the two may be obscured. Conductive layer 18 may be directly electrically and thermally connected to conductive layer 19, but is not directly electrically or thermally connected to conductive layer 20. It is to be noted that in some embodiments, a portion of conductive layer 19 extends from the first surface of dielectric layer 12 into cavity 10. In such a case, this portion of conductive layer 19 is considered to be part of conductive layer 18. Conductive layer 20 is typically thermally conductive and, in some embodiments, also electrically conductive. In some embodiments, conductive layer 20 comprises an electrically conductive circuit.

At least one embodiment of the present invention provides a flexible LESD array construction using a partially etched dielectric layer. At least one cavity 10 is etched into the dielectric layer 12 to a desired depth. The cavity may have a conductive layer 18 deposited therein in any suitable manner, such as coating, vapor deposition, plating etc., but the conductive layer 18 is typically plated either using electro or electroless plating. Conductive material, if added, may be deposited in any suitable manner such as coating vapor deposition, chemical deposition, plating, dispensing, etc. LESDs 26 are typically physically attached directly or indirectly (e.g., if there are intervening materials or layers) to conductive layer 18 using a known die bonding method such as eutectic, solder (including solder bumps for flip chip mounting), adhesive, and fusion bonding. The thin layer of dielectric material that forms the floor 17 of cavity 10 places conductive layer18 conductive layer 20 in close proximity, which allows for dissipating heat generated by the LESD efficiently through the cavity floor to thermally conductive layer 20.

Suitable conductive matter for use in the electrically and/or thermally conductive layers of the present invention will depend on the application, but may include, for example, conductive metals such as copper, silver, gold, nickel, aluminum, tin, and alloys thereof; thermally and electrically conductive adhesives, including non-conducting adhesives filled with conductive material, e.g., conductive particles, such that the resulting adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable electrically and/or thermally conductive particles include aluminum, gold, silver, chromium, copper, palladium, nickel and alloys thereof, aluminum nitride (AlN), aluminum oxide (Al2O3), barium nitride (BN), nanometer-sized silver particles, carbon blacks, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

Suitable polymeric materials for use in the flexible polymeric dielectric layer of the present invention include, but are not limited to, polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc, and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BPDA) and phenyl diamine (PDA).

Cavities may be formed in the dielectric layers using any suitable method such as chemical etching, plasma etching, focused ion-beam etching, laser ablation, embossing, microreplication, injection molding, and punching (with the subsequent addition of dielectric material). Chemical etching may be preferred in some embodiments. Any suitable etchant may be used and may vary depending on the dielectric layer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409,791, incorporated herein by reference. Subsequent to etching, the dielectric layers may be treated with an alkaline KOH/potassium permanganate (PPM) solution, e.g., a solution of about 0.7 to about 1.0 wt % KOH and about 3 wt % KMnO4. The dielectric layers may be clad on one or both sides with a conductive layer. If the conductive layer(s) are to be formed into circuits, they may be pre-patterned, or may be patterned during the process of making the flexible LES devices. A multilayer flexible substrate (having multiple layers of dielectric and conductive material) may also be used as a substrate. The conductive layers may be any suitable material, but are typically copper.

Figure 2A:
FIGS. 2A-2C depict a process for preparing an embodiment of the present invention.
Figure 2B:
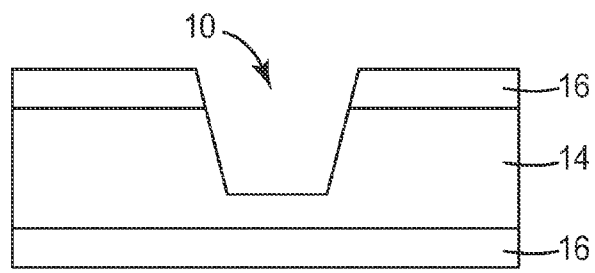
Figure 2C:
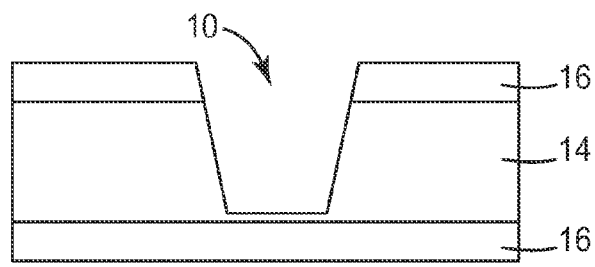

FIGS. 2A-2C illustrate a UPISEL VT dielectric layer having a cavity etched according to an embodiment the present invention. As shown in FIG. 2A, UPISEL VT is constructed of a core layer 14 comprising UPILEX S and thin outer layers 16 comprising a thermoplastic polyimide (TPPI). The UPISEL VT may be etched using any suitable chemistry, such as KOH/ethanol amine/ethylene glycol described in more detail on U.S. Patent Publication. No. 2007-0120089-A1. With this etchant, it was found that the hydrophobic nature and higher modulus of the UPILEX S resulted in etching by a dissolution mechanism that resulted in the side walls of the cavity being very smooth. As shown in FIG. 2B, because this etchant formulation etched quickly, the etching was stopped before the cavity reached the second TPPI layer, then, as shown in FIG. 2C, a subsequent etching was performed with a KOH/potassium permanganate (PPM) solution, comprising about 0.7 to about 1.0 wt % KOH and about 3 wt % KMnO4, which was not an effective etchant of the TPPI layer, to remove the remaining thin layer of UPILEX S core, thereby leaving the thin TPPI layer at the bottom of the etched cavity.

In at least some embodiments of the present invention, the thickness of the cavity floor may be any suitable thickness and is typically about 5% to about 90% of the thickness of the dielectric layer. In various embodiments, the thickness is about 5% to about 75%, about 5% to about 60%, about 5% to about 50%, or about 5% to about 25% of the thickness of the dielectric layer. In at least one embodiment, it has been found that a suitable thickness for the cavity floor is about 15 micrometers, regardless of the total thickness of the dielectric layer, which typically has a thickness of about 25 micrometers or greater.

Another suitable etchant chemistry for etching the dielectric layer of the present, in particular when the layer comprises UPISEL VT, is the KOH/glycine chemistry described in more detail in co-pending U.S. Provisional Patent Application No. 61/409,791. It was found that the KOH/glycine etchant was well-suited to etch the UPISEL VT because it provided a slow, controlled etching that enabled the inventors to control the thickness of the dielectric material at the bottom of the etched cavity.

Figure 3A:
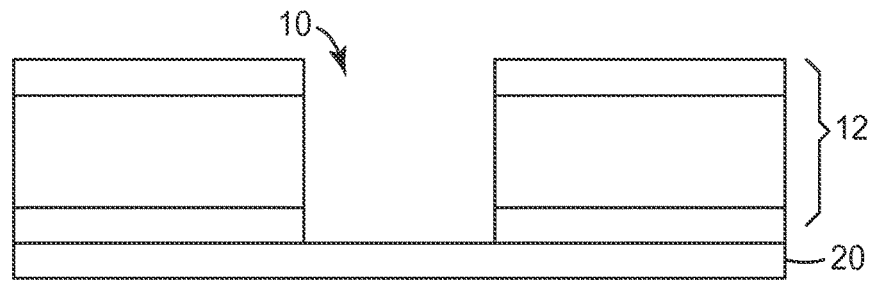
FIGS. 3A-3B and 3B' depict a process for preparing an embodiment of the present invention.
Figure 3B:
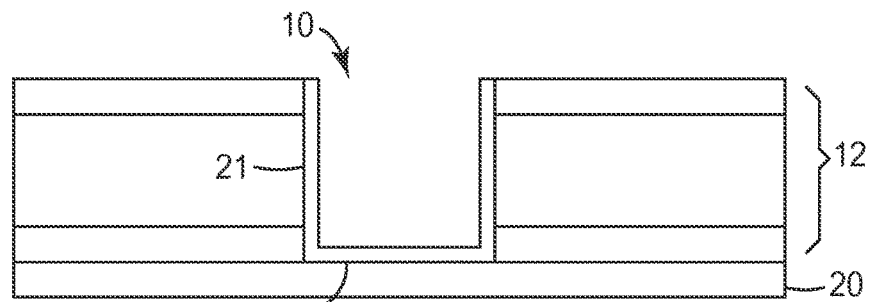
Figure 3B:
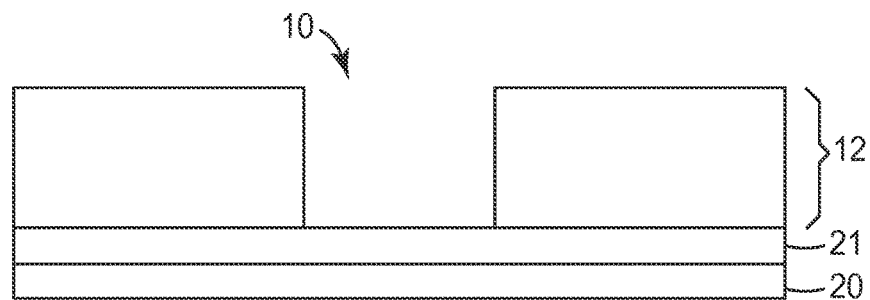

The side wall angle resulting from chemical etching varies, and is most dependent on etch rate, with slower etching rates resulting in shallower (i.e., closer to 0°) side wall angles. Typical side wall angles resulting from chemical etching are about 5° to 60° from the major plane of the dielectric layer, and in at least one embodiment, about 25° to about 28°. As previously mentioned as an alternative to chemical etching, cavities in the dielectric layer may be formed by plasma etching, focused ion-beam etching, laser ablation, and punching. With these methods of forming a cavity, the side walls typically have a steeper angle, e.g., up to 90° from the major plane of the dielectric layer. For purposes of this application, a sloped side wall means a side wall that is not perpendicular to the horizontal plane of the dielectric layer. Cavities with sloped sidewalls could also be made using methods such as embossing, microreplication, and injection molding. In some cases, such as with punching, a hole is formed all the way through the dielectric layer. In such a case (or in a case where chemical etching is used to etch completely through the dielectric layer), a dielectric coating, such as a polyimide coating, is added to electrically insulate the cavity from a conductive layer on the bottom side of the dielectric layer. The dielectric material may be any suitable material, e.g., a polymeric material, a ceramic material, a particle-loaded polymeric material, etc. The dielectric coating may be applied in any suitable manner for the material being applied. The dielectric coating is preferably thermally conductive to facilitate transfer of heat away from the LESD. A conductive layer may be applied to the bottom side of the dielectric layer before the cavity is formed if the cavity-forming method would not destroy the conductive layer, e.g., because the etching depth can be controlled and/or because the cavity-forming method will not etch or degrade the conductive layer, such as with plasma etching, or it may be added after the cavity is formed if the cavity-forming method would destroy the conductive layer, such as with punching, or if an embodiment such as that illustrated in FIG. 3B' is desired. FIGS. 3A-3B illustrate a process in which a UPISEL VT dielectric layer 12, having a conductive layer 20 clad on one side, is etched all the way through to the conductive layer (FIG. 3A), then a dielectric coating 21 is applied to the opening to form a cavity floor and insulate the cavity from the conductive layer (FIG. 3B).

FIG. 3B' illustrates an embodiment in which the floor of cavity 10 is formed by a dielectric coating 21 that extends along the surface of conductive layer, including beneath dielectric layer 12.

The dielectric coating may be any material suitable for the resulting article that is electrically insulating and, preferably, thermally conducting. It may be organic or inorganic, or a combination thereof. For example, it may comprise an organic polymer or adhesive filled with inorganic particles. The dielectric coating may be any suitable thickness as long as it electrically separates cavity 10 from conductive layer 20.

One such suitable coating is a polyimide resin formed by first applying a thin layer of polyamic acid resin in the opening. The polyamic acid is preferably precision-coated such that the dielectric coating formed at the bottom of the cavity provides the desired thickness for the cavity floor. Subsequently, an imidization process is carried out to form a uniform polyimide coating in the cavity. The polyimide/polyamic acid resin can be applied using precision coating, knife coating, or other methods known in the art.

In some embodiments, the dielectric coating may be filled with particles to enhance its thermally conducting properties. Suitable particles include aluminum nitride (AlN), aluminum oxide (Al2O3), barium nitride (BN), nanometer-sized silver particles, carbon nanotubes (CNT), fullerenes, graphenes, carbon fillers, barium titanate, barium strontium titanate, titanium oxide, lead zirconium titanate, calcium copper titanate, lead magnesium titanate, lead lanthanum zirconate titanate, silicon dioxide, and mixtures thereof.

In another embodiment similar to that illustrated in FIGS. 3A-3B, the dielectric layer 12 may be UPISEL VT or any other suitable etchable polymeric dielectric material and the conductive layer 20 may be a thermally conductive adhesive. The adhesive layer may be used as an etch stop or may be applied to the dielectric layer after the opening is formed. If the thermally conductive adhesive is used as an etch stop, suitable adhesives are those that are resistant to chemicals, especially those resistant to alkali solutions. After the opening is formed, dielectric material 21 can optionally be applied in the opening including on the thermally conductive adhesive adjacent the opening. Other layers may be applied to the opposite side of the thermally conductive adhesive layer (before or after the adhesive is applied to the dielectric layer). For example, thermal interface materials, metal foils, rigid metal plates, heat sinks, etc. can be attached to the adhesive layer. Having the thermally conductive adhesive layer adjacent cavity 10 can enhance the dissipation of heat away from the LESD which sits in the cavity. The thermal conductivity of the adhesive can be tailored by adding required amount of suitable thermally conductive particle and by tailoring the thickness of the adhesive. Typical thermally conductive particle used in thermally conductive adhesives are aluminum nitride (AlN), aluminum oxide (Al2O3), barium nitride (BN), nanometer-sized silver particles, carbon nanotubes (CNT), fullerenes, graphenes, carbon fillers, etc. The size of the particles is typically in the sub-micron to micron range. The typical thermal conductivity of such filled adhesives is from about 0.2 to about 6 W/mK.

Suitable adhesive types for use in thermally conductive adhesives include, but are not limited to, epoxies, polyurethanes, polyamideimides, and phenolic resins.

Suitable curing processes for the thermally conductive adhesives include, but are not limited to, thermal, UV, E-beam, UV-beta stage (a combination of UV and thermal cure in which the adhesives are coated onto a liner, subjected to an initial UV cure initially, then laminated onto a substrate and thermally cured), and combinations thereof.

If the adhesive is adhered to a conductive, e.g., copper, layer before being applied to the dielectric layer, the adhesive typically is either coated on a liner and laminated with a copper foil or coated directly on the copper foil. Electrodeposited or rolled annealed coppers are preferred. If the copper has a rough side and a smooth side, it is typically preferable to attach the adhesive to the rough side.

Figure 4:
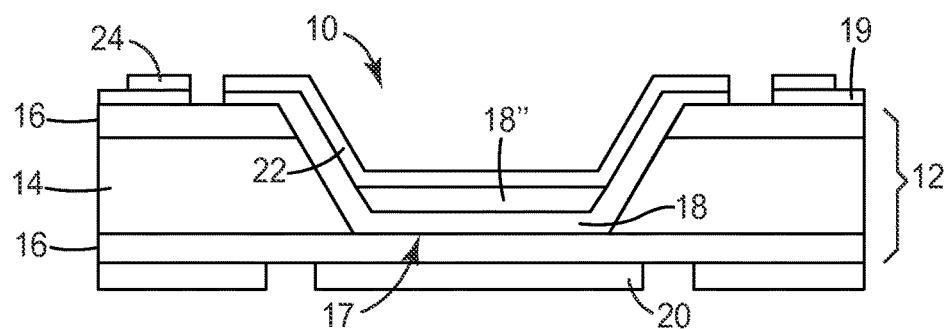
FIG. 4 depicts an embodiment of the present invention.

FIG. 4 illustrates an embodiment of the present invention in which a cavity 10 has been formed in dielectric layer 12. An array of similar cavities may be formed in the dielectric layer. In this embodiment, dielectric layer 12 comprises a UPISEL VT material having a polyimide core 14 and thermoplastic polyimide (TPPI) outer layers 16. The floor 17 of the cavity 10 comprises the bottom TPPI outer layer 16. Conductive layer 18 has been applied to the floor and walls of the cavity and extends up onto the top TPPI outer layer 16. On the central portion of conductive layer 18 is added conductive material 18'. Conductive layer 18 may be electrically connected to conductive layer 19 or may be insulated from it.

In at least some embodiment of the present invention, the combined matter of conductive layer 18 and conductive material 18' may be as thin on the floor or cavity 10 as it is on the cavity walls, or it may be thinner or thicker. If it is thicker, it may partially or fully fill the cavity. In the embodiment illustrated in FIG. 4, the added conductive material 18' results in a thicker amount of conductive matter on the floor of the cavity and on the lower portion of the cavity wall than it is on the upper portion of the cavity wall and, therefore, conductive matter partially, e.g., about 25%, fills the cavity. Conductive layer 18 and material 18' may be any suitable thickness, e.g., 10%, 15%, 25% or greater of the cavity depth. In some embodiments, the conductive layer 18 and material 18' fill a larger percentage of the cavity, e.g., about 50%, about 75%, or about 100%. Although in many instances in this application, reference is made only to conductive layer 18 in cavity 10, it is to be understood that conductive material 18' may also exist in cavity 10, even though it is not explicitly mentioned. Conductive layer 20 is adjacent the bottom TPPI outer layer 16. In this embodiment, it is a conductive circuit that may be made by standard methods known in the art. Conductive layer 20 may be any suitable thickness. Making conductive layer 20 thick, e.g., about 35 micrometers (um), preferably about 50 um, about 75 um, about 100 um or more may enhance heat removal from the LESDs.

In FIG. 4, a reflective coating 22 is further applied over the conductive layer 18 in the cavity. The reflective coating may be gold, silver, aluminum with enhanced reflectivity, an inherently reflective dielectric material, or a pigmented material. The reflective coating may exist between the conductive layer and the LESD or may be absent under the LESD so that the LESD sits directly on the conductive layer (or another intermediate layer). If the reflective coating is located between the conductive layer and the LESD, it is preferably thermally conductive and/or thin to allow for the transfer of heat from the LESD to the conductive layer 18. Conductive bumps 24 (which may be Au, AuSn, AuGe, AuSi, or other suitable materials) are added for wire bonding the LESD to conductive layer 19.

Figure 5:
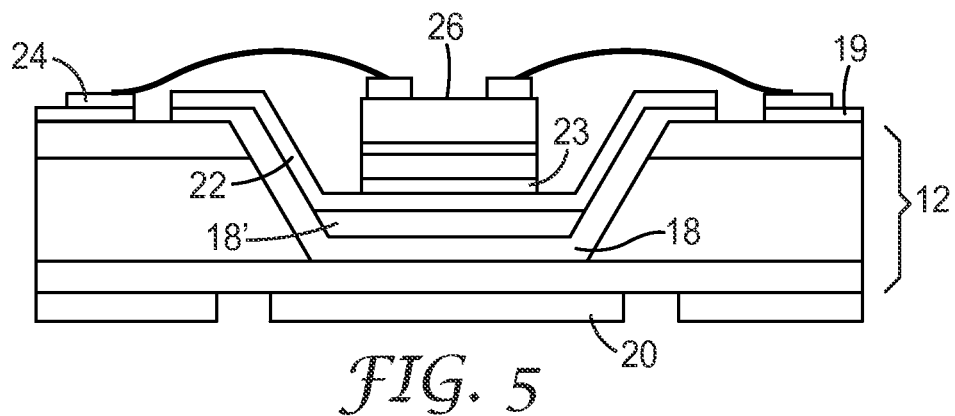
FIG. 5 depicts an embodiment of a flexible LESD of the present invention.

FIG. 5 illustrates an embodiment of the present invention similar to FIG. 4 in which passivation layer 23 has been applied to the bottom of LESD 26 to facilitate die bonding the LESD to reflective layer 22. Suitable passivation materials include metals such as Au and intermetallic alloys(s) such as AuSn, AuGe, AuSi. LESD 26 is wire bonded to conductive bumps 24. Different types of die bonding such as eutectic, fusion, and adhesive bonding can be employed to attach the LESD in the cavity. With some types of bonding, e.g., eutectic bonding, it is preferable to deposit intermetallic alloys on the bottom of the LESD to facilitate bonding to the conductive layer/material or reflective coating (or other intermediate layer) on the dielectric layer. For example, if the LESD will be eutectically bonded to a gold reflective coating, it is preferable to coat the bottom of the LESD with a gold/tin metal layer. The temperature involved for attaching the LESD to the reflective or conductive layer in the cavity is typically about 285° C. to 325° C. for eutectic bonding with Au/Sn. The LESDs may be adhered by other methods such as organic die attach, e.g., using silver epoxy, or soldering. Eutectic bonding is considered a direct bonding method while soldering is considered an indirect bonding method.

At least some embodiments of the flexible LES devices of the present invention provide excellent heat management properties. Due at least in part to the conductive layers and thin dielectric floors of the cavities supporting the LESDs, heat generated by the LESDs can be readily transmitted to the conductive layer on the bottom side of the dielectric layer. In this manner, heat can be readily conducted away from the LESD. This is explained in more detail is Example 4. Additionally, having a conductive layer in the cavity that essentially follows the contours of the cavity can maximize the surface area of the conductive layer, which may improve heat dissipation. Cavities with shallow angles will, in general, provide walls with larger surface areas, which may provide better heat dissipation. In at least some embodiments of the present invention, a thickness of at least about 50 um for the bottom conductive layer 20 was found to achieve good thermal and structural performances. Additionally, the amount of conductive matter in the cavity can be controlled to further influence heat management. In some embodiments, conductive layer 19 extends into cavity 10, including onto floor 17 thus forming all or part of conductive layer 18. Optionally, additional conductive matter can be deposited in cavity 10 to increase the thickness of the conductive layer 18. In some embodiments, the entire conductive layer 19 (including the portion that comprises conductive layer 18) is made relatively thick and no additional conductive material 18' is added in cavity 10. In at least some embodiments of the present invention, it was found that a conductive, e.g., copper, layer 19 (and layer 18) with a thickness of about 50 um to about 100 um, preferably about 75 um to about 100 um, on the dielectric layer surface, and in the cavity, significantly enhanced heat dissipation from the LESD and/or the solder layer beneath the LESD to conductive layers 18 and 19. Having this thick conductive layer in the cavity provided enhanced vertical and lateral heat spreading from the LESD and/or solder layer to conductive layers 18 and.

As is shown in more detail in Examples 5 to 7, the inventors also found that controlling the area dimensions of the floor 17 of cavity 10 in which the LESD is supported can significantly influence heat dissipation from the LESD and/or the solder layer beneath the LESD to the conductive layer 18, and further to the conductive layer 20 adjacent the cavity floor. Generally, increasing the ratio of the cavity floor area to the LESD footprint area provides better heat dissipation. It was found that ratios of 1:2 (LESD footprint: cavity floor area) and above showed improvement with respect to heat dissipation over a 1:1 ratio, with a ratio of 1:3 showing the most significant increase in heat dissipation. It is believed that this ratio helps dissipate heat in the z direction before spreading the heat out over a larger surface area, e.g., using an adjacent heat transfer layer. Although a ratio of 1:2 helps with heat dissipation and higher ratios such as 1:4 may be used, it was found that a 1:3 ratio provided a significant improvement over, e.g., a 1:1 ratio, while a 1:4 ratio provided only an incremental improvement over a 1:3 ratio. This can be seen by the data in Table 3 in which the thermal resistances for a particular embodiment made with ratios of 1:2 to 1:5 are shown.

The LESDs can be packaged directly on the flexible dielectric layer, e.g., by applying an encapsulating material over individual LESDs and the cavities on or in which they are located, or by applying an encapsulant over an array of LESDs and the conductive layer around such LESDs. The encapsulant is preferably a transparent (i.e., having a transmittance over 99%) molding compound.

In at least one embodiment of the present invention, the encapsulant is a transparent color conversion material, which can absorb light emitted from the LES of the LESD and re-emit the light at a different, typically higher, wavelength. For example, a color conversion material containing yellow phosphors may be used to encapsulate a blue LED, which can produce a white light. In some embodiments of the present invention, the slopes of the cavity sidewalls can be tailored to create a uniform thickness of the color conversion layer surrounding the LESD to provide uniform light conversion, and preferably, superior thermal management. In at least one embodiment of the present invention, the slopes of the cavity sidewalls are about 5° to about 90°. An advantage of at least one embodiment of the present invention is that placing the LESD in a cavity enables precise placement of the encapsulant because it can be contained in the cavity. An advantage of at least one embodiment of the present invention is that placing the LESD in the center of a cavity and filling the cavity with encapsulant creates uniform light conversion due to the uniform layer of encapsulant that can be created around the LESD. In an alternate embodiment of the present invention, instead of encapsulating the LESD with the color conversion material, a layer of the color conversion material is coated on the floor of the cavity prior to placing the LESD in the cavity. In this manner, the color conversion material can absorb at least some of the light emitted from the LES and re-emit the light at a different, typically higher, wavelength. An example of a suitable color conversion material is a phosphor-filled encapsulant. Such an encapsulant may be made by mixing yellow phosphor, such as that available under the trade designation ISIPHOR SSA612100 from Merck, with a suitable silicone encapsulant having suitable adhesion properties. A weight ratio of 75% phosphor to silicone adhesive may be suitable in some embodiments. After the encapsulant is dispensed into the cavity, in some embodiments it may be cured by exposure to UV light at 80° C. for an hour.

The encapsulant may optionally be suitable to act as a lens when cured. Silicones and epoxies are suitable encapsulating compounds. The encapsulant may further contain optical diffusing particles distributed therein. Suitable encapsulating (molding) compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

Figure 6:
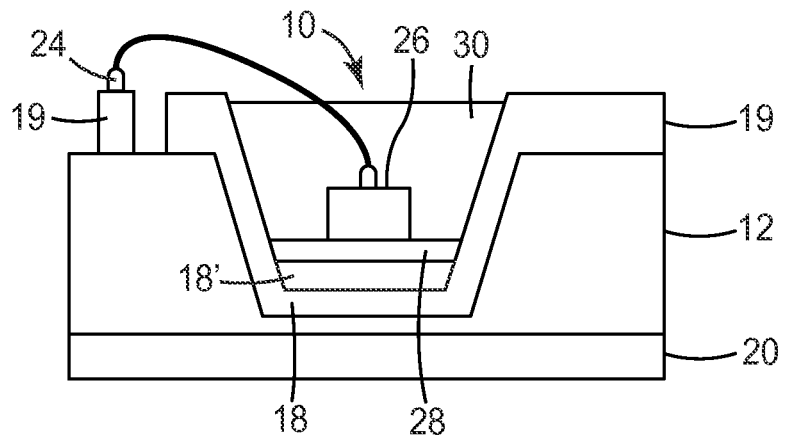
FIG. 6 depicts an embodiment of a flexible LESD of the present invention.

FIG. 6 illustrates an embodiment of the present invention in which a cavity structure similar to those in FIGS. 4 and 5 has been formed in dielectric layer 12, an LESD 26 having a height less than the depth of the cavity 10 has been attached to conductive layer 18 or conductive material 18' in the cavity 10 with solder 28, and the cavity 10 has been filled with an encapsulant 30 that covers the LESD. A wire bond extends out of the encapsulant 30 and connects with bond pad 24.

Figure 7A:
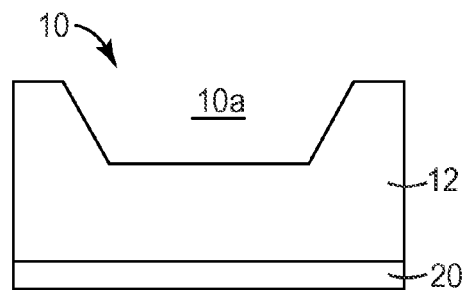
FIGS. 7A-7D depict a process for preparing a flexible LESD of the present invention and the resulting flexible LESD.
Figure 7B:
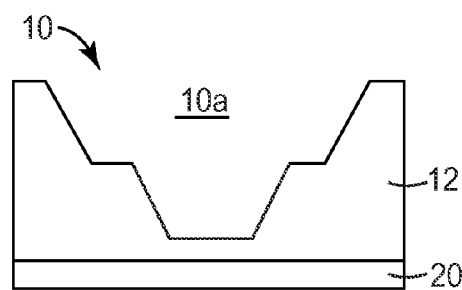
Figure 7C:
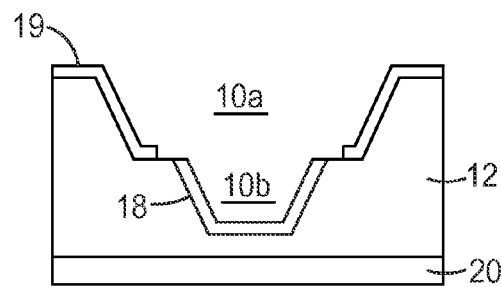
Figure 7D:
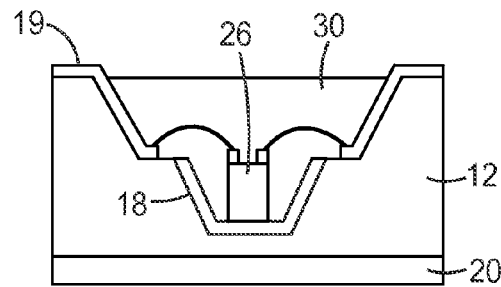

FIGS. 7A-7D illustrate a method of making an alternate embodiment of the present invention in which the LESD has a height less than the depth of the cavity, and the resulting article. In the embodiment of FIGS. 7A-7D, the LESD can be wire bonded inside the cavity and the wire bonds can be encapsulated, thereby increasing the robustness of the wire bonds in the final embodiments. In this embodiment, the cavity 10 has an upper portion 10a near the first major surface of the dielectric layer 12 and a lower portion 10b near the second major surface and the diameter of the upper cavity portion 10a is greater than the diameter of the lower cavity portion 10b. The slopes of the upper and lower cavity portions can be any slopes that are suitable for the desired application and can be the same or different. Each slope will typically be between about 5° to about 90°. This embodiment can be created by starting with a dielectric layer 12 having conductive layer 20 on a second major surface thereof. The first major surface of dielectric layer 12 is covered with a patterned photomask and the exposed portions are etched to form the upper cavity portion 10a to the desired diameter and wall slope as shown in FIG. 7A. Then the outer portion of the newly created cavity floor, as well as the cavity walls and first major surface of the dielectric layer, is covered with a photomask, and the central portion of cavity 10 is further etched to the desired depth, as shown in FIG. 7B. Subsequently, as shown in FIG. 7C, the walls of upper cavity portion 10a can be coated with a portion of the conductive layer 19 that extends from the first major surface of dielectric layer 12 into upper cavity portion 10a, which portion of conductive layer 19 forms part of an electrical circuit and, optionally, the lower cavity portion 10b and the cavity floor may be coated with a thermally conductive layer 18 (which, if also electrically conductive is electrically separated from at least one side of the portion of conductive layer 19 in upper cavity portion 10a). As shown in FIG. 7D, LESD 26 can be placed at the bottom of the cavity and wire bonded to the portion of conductive layer 19 that extends into upper cavity portion 10a. Thereafter, cavity 10 may be filled with an encapsulant 30.

Figure 8A:
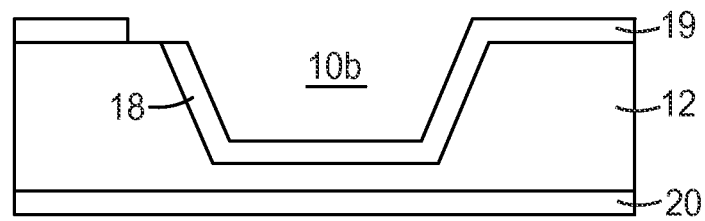
FIG. 8A-8D" depict a process for preparing a flexible LESD of the present invention and the resulting flexible LESDs.
Figure 8B:
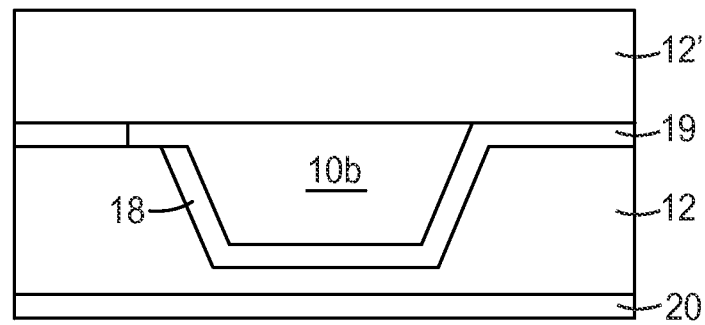
Figure 8C:
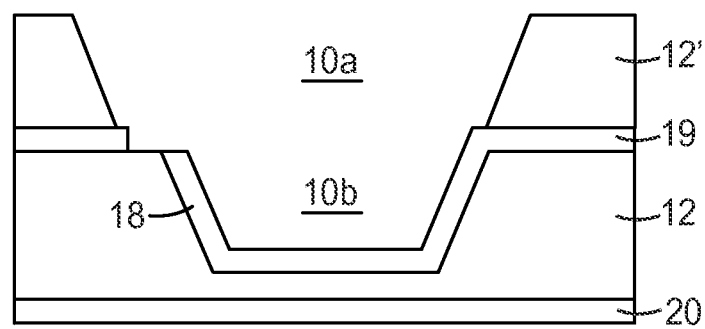
Figure 8D:
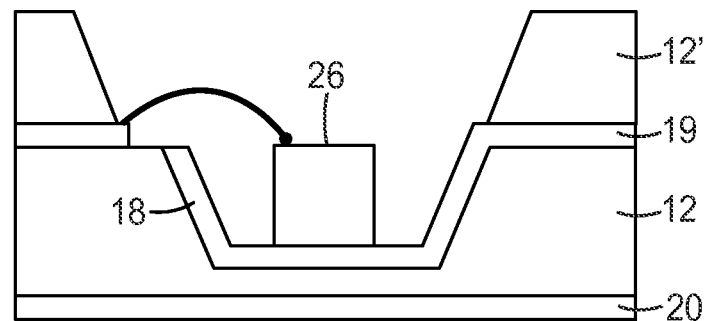
Figure 8D:
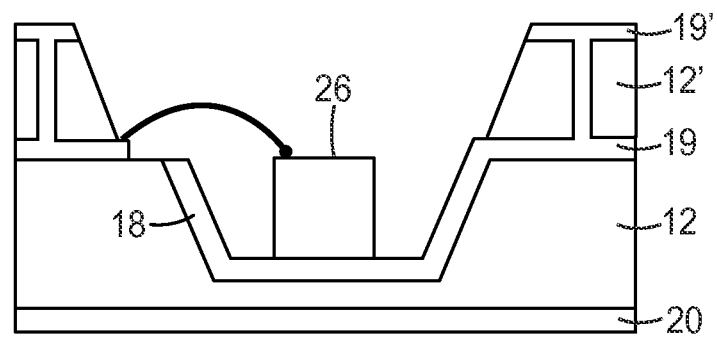
Figure 8D:
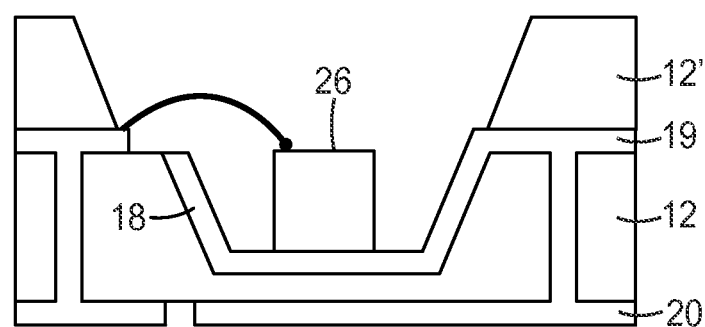

FIGS. 8A-8D illustrates a method of making an alternate embodiment, similar to FIGS. 7A-7D, in which the LESD has a height less than the depth of the cavity, and the resulting article. The embodiments of FIGS. 8A-8D as well as 8D' and 8D" differ from the embodiment of FIGS. 7A-7D in that the final embodiments have two dielectric layers 12 and 12' separated by conductive layer 19. In this embodiment, the cavity 10 has a lower portion 10b formed in flexible dielectric layer 12 and an upper portion 10a formed in flexible dielectric layer 12'. The lower cavity portion 10b is formed in dielectric layer 12 first. Conductive layer 19 may be deposited on dielectric layer 12 before or after lower cavity portion 10b is formed. If deposited afterward, it may be deposited at the same time that conductive layer 18 is deposited in lower cavity portion 10b. As illustrated in FIG. 8B, dielectric layer 12' is applied over conductive layer 19. As illustrated in FIG. 18C, upper cavity portion 10a is then formed in dielectric layer 12'. The diameter of upper cavity portion 10a is typically greater than the diameter of lower cavity portion 10b. The slopes of the upper and lower cavity portions can be any slopes that are suitable for the desired application and can be the same or different. Each slope will typically be between about 5° to about 90°. As illustrated in FIG. 8D, an LESD 26 may then be placed at the bottom of the cavity and wire bonded to the portion of conductive layer 19 on dielectric layer 12. In an alternate embodiment, as illustrated in FIG. 8D', conductive layer 19' may be deposited on dielectric layer 12' and an electrical connection may be made between conductive layers 19 and 19' through dielectric layer 12'. In yet another embodiment, as illustrated in FIG. 8D", an electrical connection may be made between conductive layers 19 and 20 through dielectric layer 12, prior to the application of dielectric layer 12'. In any of these embodiments, the walls of upper cavity portion 10a optionally may be coated with conductive layer (not shown). Thereafter, cavity 10 optionally may be filled with an encapsulant (not shown).

Figure 9:
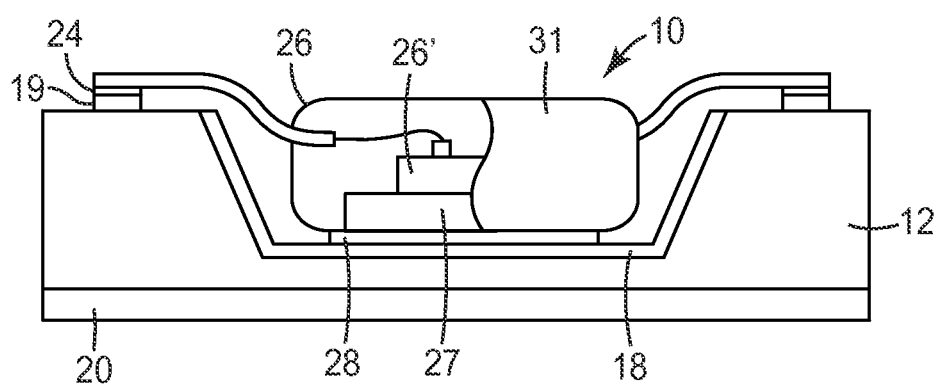
FIG. 9 depicts an embodiment of a flexible LESD of the present invention.

FIG. 9 illustrates an embodiment of the present invention in which a cavity structure similar to that in FIG. 6 has been formed in the dielectric layer. In this embodiment, the LESD 26 is a complete LES package including an LED die 26' and a heat sink 27 surrounded by an encapsulant 31. The body of the LESD resides in the cavity 10 and is attached to conductive layer 18 in the cavity with solder 28, while the contact leads extend to bond pads 24 on conductive layer 19.

Figure 10:
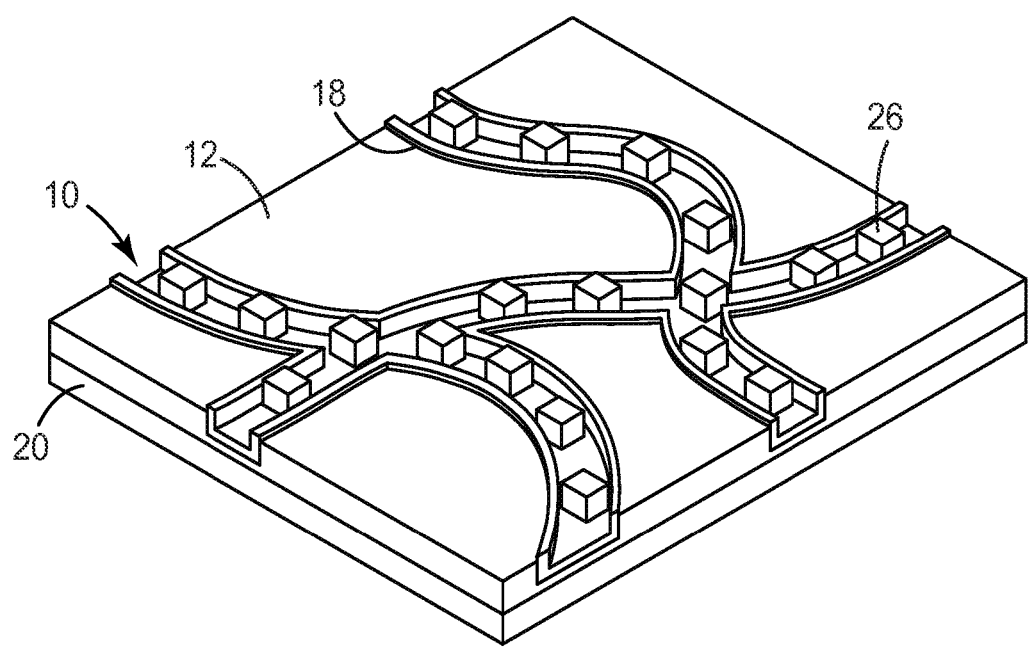
FIG. 10 depicts an embodiment of a flexible LESD of the present invention.

Arrays of LESDs can be placed in any desired pattern. For example, FIG. 10 illustrates an array of LESDs 26 within a cavity 10 formed in dielectric layer, the LESDs 26 located on conductive layer 18 in cavity 10. In this embodiment, cavity 10 is a pattern of overlapping serpentine channels.

FIGS. 11A and 11B illustrate a top view and a cross section view, respectively, of a flexible dielectric layer 12 having multiple large cavities 10 in which are located multiple LESDs connected in series and parallel and electrically connected to conductive layer 19 on the surface of flexible dielectric layer 12. The LEDs are supported by conductive layer 18 on the floor of cavity 10. Conductive layer 18 can transfer heat from the LESDs 26 to conductive layer 20 opposite the thin cavity floor. In at least some embodiments of the present invention, the dielectric layer and the conductive layers on one or both of the top and bottom surface of the dielectric layer support and surround the LESDs, thereby providing a flexible, robust LESD package.

The flexible LES devices of the present invention can be made in a batch process or a continuous process such as a roll-to-roll process that is often used in making flexible circuits. The LESDs can then be divided as desired, e.g., singulated into individual LESDs, strips of LESDs, or arrays of LESDs, e.g., by stamping or by slitting the articles. Accordingly, an entire reel of LESDs on a flexible substrate can be shipped without the need for the traditional tape and reel process in which individual LESDs are typically transported in individual pockets of a carrier tape.

Before or after forming individual, strips, or arrays of LESDs, the flexible LESDs can be attached to an additional substrate, for example by attaching the conductive layer on the second major surface of the dielectric layer to the additional substrate with a thermally conductive adhesive. The thermally conductive adhesive can further facilitate the transfer of heat away from the LESD. Alternatively, the conductive layer on the second major surface of the dielectric layer may be treated with metals or other materials that will facilitate its adhesion to a substrate. The substrate may also be thermally conductive, e.g., a rigid metal strip, or may be a semiconductor or ceramic substrate, which may or may not be thermally and/or electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LESDs are for use on a circuit board, the flexible LES devices, whether in singulated, strip, or array form can be directly attached to an end user's circuit board, thereby eliminating the need for conventional lead frame materials. If the LESDs are for use as a lighting strip, they could be enclosed in a waterproof/weatherproof, transparent casing, as described above. If the LESDs are in strip or array form, they may be electrically connected to one or more of the other LESDs in the strip or array. Additional elements such as Zener diodes and Schottky diodes can also be added to the flexible dielectric layer prior to be division of the flexible LES devices. These elements may also be electrically connected to the LESDs.

In at least one embodiment of the present invention, the flexible LES devices are thinner than conventional single or multiple LESD packages because the LESD sits below the surface of the dielectric layer. This enables the flexible LES devices of the present invention to be used in applications with tight volume restrictions, such as cell phones and camera flashes. For example, the flexible LES devices of the present invention can provide a package profile of approximately 0.7 to 4 mm, and in some embodiments 0.7 to 2 mm whereas conventional LESD package profiles are typically greater than 4 mm and are approximately 4.8 mm to 6.00 mm. Moreover, the flexible LES devices of the present invention can be flexed or bent to easily fit into a non-linear or non-planar assembly if desired.

In at least one embodiment, the dielectric layer and conductive layers thereon provide a thin and compliant support for the LESDs. In at least one embodiment, the total thickness of the conductive layer is less than 200 micrometers, preferably less than 100 micrometers, and most preferably less than 50 micrometers. In at least one embodiment, the thickness of the dielectric layer is preferably 50 micrometers or less.

EXAMPLES

This invention is illustrated by the following examples, but the particular materials and amounts thereof recited in these examples, as well as other conditions and details should not be construed to unduly limit this invention.

Etching Method

The general procedure for preparing the etchants included first dissolving 37 wt % potassium hydroxide (KOH) in water by mixing, followed by the subsequent addition of 3.5 wt % ethylene glycol and 22 wt % ethanolamine. Samples of 50 μm polyimide dielectric layer with 3 μm copper layer clad on one side, available under the trade designation UPISEL-N from UBE Industries, Ltd., Tokyo, Japan, was subjected to selective etching from the PI side using aqueous photoresist, available under the trade designation HM-4056 from Hitachi Chemicals, Japan, as an etch mask. The etching was controlled by timing to create a cavity having a thin floor of polyimide at the etch site, which took approximately 15 minutes.

Circuit-Forming Method

A 20 inch (50.8 cm) wide by 20 m long sample of 50 μm polyimide with 3 μm copper clad on one side, available under the trade designation UPISEL-N from UBE Industries, Ltd., Tokyo, Japan was first slit into a 13.4 inch (34.04 cm) width. Following removal of the 18 μm copper carrier layer from the polyimide (PI) side, cavities were formed in the sample by laminating dry film photoresist, available under the trade designation HM4056 from Hitachi Chemicals, Ltd. on both sides and creating a patterned etch mask on the polyimide side using a photolithography process. The sample was then subjected to a chemical etching process using the Etching Method described above for approximately 15 minutes to create a cavity in the polyimide layer having a floor thickness of about 5 μm. After removing the photoresist from both sides, the exposed PI surface of the sample was first subjected to seeding of a chrome tie layer having a thickness of 2-20 nm by vacuum deposition, then to depositing copper to a thickness of about 100 nm on the tie layer by vacuum deposition to form a conductive coating. The conductive coating was then subjected to electroplating to build up the conductive copper coating to a final thickness of about 3 μm. This provided a structure of a conductive coating in the etched cavity and on the entirety of the PI dielectric layer. Photoresist was then applied on both sides of the copper clad (on one side) and copper coated (on the other side) dielectric layer and patterned on the copper coated side by a re-registration photolithography process. 45 lam of copper was electrodeposited onto the exposed portions of the thin electrodeposited copper on the etched PI side. Then after the photoresist was removed from the etched PI side, the exposed portions of the 3 μm copper layer and the chrome tie layer were removed to create circuit patterns on the dielectric layer. This resulted in conductive electrodes having a thickness of 35 μm between the exposed portions of the polyimide layer and a 35 lam copper coating in the etched cavities.

Example 1

Following is an example of packaging LESDs on a flexible substrate, specifically, mounting blue LEDs in cavities of a flexible dielectric layer with organic die attach.

Conductive circuits were formed on, and a plurality of cavities was formed in, a flexible dielectric layer using the Circuit-Forming Method described above. Each cavity floor had a thickness of about 5 μm and a conductive coating of electroplated copper of about 35 μm, resulting in a remaining cavity depth of about 10 μm. In each cavity, a Cree EZ 290 Gen II LED, available as part number CA460EZ290-S2100-2 from Cree, Inc., Durham, N.C., U.S.A., was bonded to the conductive coating using a silver epoxy organic die attach available from Quantum Materials, San Diego, U.S.A. with thermal curing done at 150° C. for 1 hour. Each LED was wire bonded to the conductive circuit on the top surface of the dielectric layer with gold bonding pads using a manual wire bonder, available under the trade designation 4524D from Kulicke and Soffa Industries, Inc., Fort Washington, Pa., U.S.A., using 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 2

Following is another example of packaging LESDs on a flexible substrate, specifically, mounting blue LEDs in cavities of a flexible dielectric layer with direct die attach bonding.

Conductive circuits were formed on, and a plurality of cavities were formed in, a flexible dielectric layer using the Circuit-Forming Method described above. Each cavity had a floor thickness of about 5 μm and a conductive coating of electroplated copper of about 35 μm, resulting in a remaining cavity depth of about 10 μm. In each cavity, a Cree EZ 290 Gen II LED, available as part number CA460EZ290-S2100-2 from Cree, Inc., Durham, N.C., U.S.A., was bonded to the conductive coating using gold-tin at an 80:20 ratio. Each LED was wire bonded to the conductive circuit on the top surface of the dielectric layer through gold bonding pads using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 3

Following is another example of packaging LESDs on a flexible substrate, specifically, mounting blue LEDs in cavities of a flexible dielectric layer with indirect die bonding.

Conductive circuits were formed on, and a plurality of cavities was formed in, a flexible dielectric layer using the Circuit-Forming Method described above. Each cavity had a floor thickness of about 5 μm and a conductive coating of electroplated copper of about 35 μm, resulting in a remaining cavity depth of about 10 μm. In each cavity, a Cree EZ 290 Gen II LED, available as part number CA460EZ290-S2100-2 from Cree, Inc., Durham, N.C., U.S.A., was bonded to the conductive coating using solder in between the LED and the conductive coating. Each LED was wire bonded to the conductive circuit on the top surface of the dielectric layer through gold bonding pads using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 4

Figure 12A:
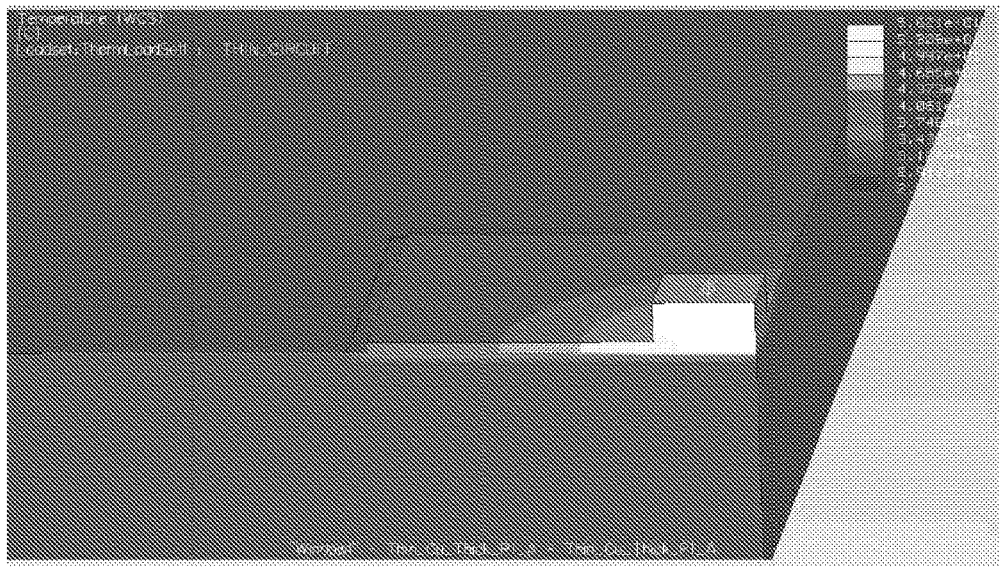
FIGS. 12A-12D depict the results of thermal modeling for comparative flexible LES devices and flexible LES devices of the present invention.
Figure 12B:
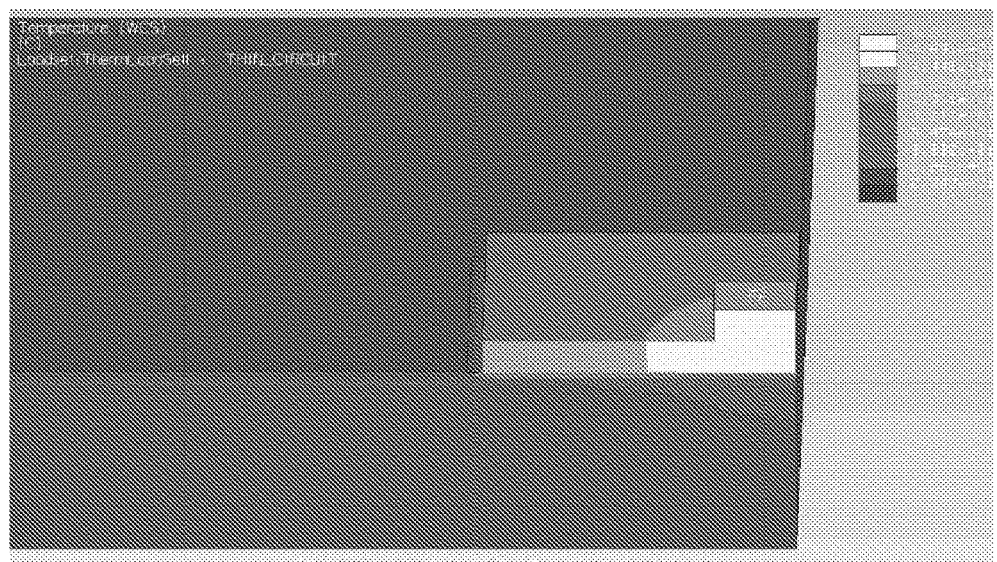
Figure 12C:
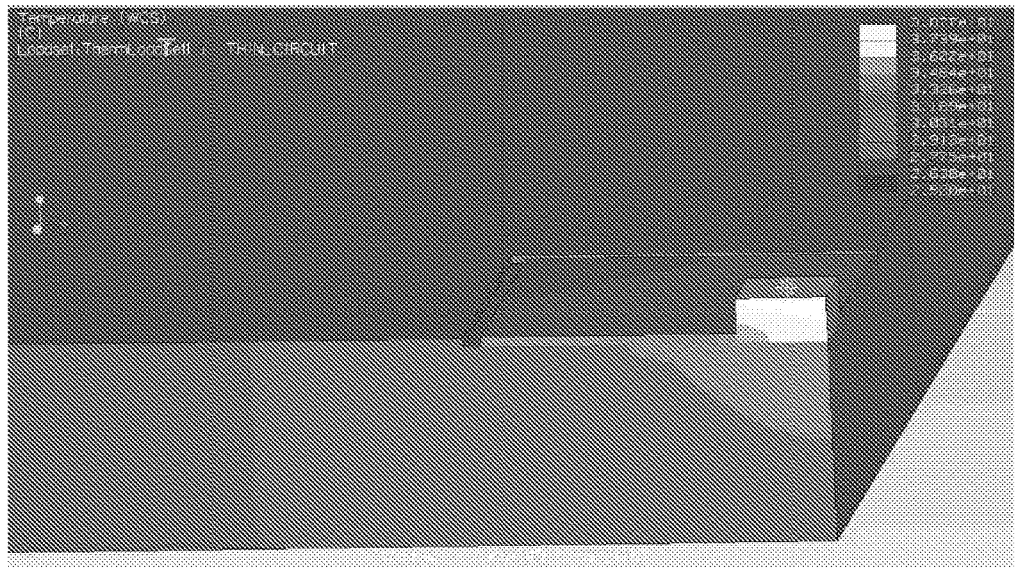
Figure 12D:
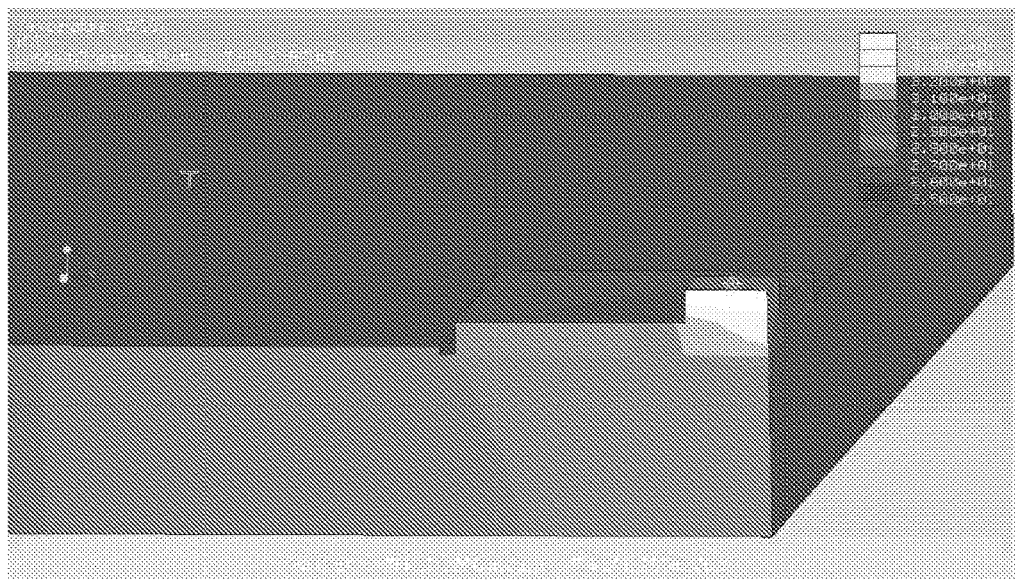

FIGS. 12A-12D show the results of thermal modeling that was executed to replicate heat transfer of (1) comparative standard LED devices with thick dielectric layers between the LEDs and a thermally conductive layer (FIGS. 12A and 12B) and (2) the flexible LESD devices of the present invention having thin dielectric layers between LEDs and a thermally conductive layer (FIGS. 12C and 12D). The thermal modeling was conducted using a Computer Aided Design (CAD) software program available under the trade designation Pro/ENGINEER from PTC, Needham, Mass., U.S.A. The design parameters used for the modeling to calculate the heat dissipation on two different thicknesses of polyimide are as follows:

10×10×2 mm aluminum plate, with outer edges held at a constant 25° C. temperature.
4×4×0.05 mm gold-tin eutectic solder.
4×4×0.05 mm electroplate copper.
10×10×0.05 mm polyimide circuit (with center area thickness 4×4×X, where X is either 47 mm or 5 mm). Material properties of UPILEX-S were used.
4×4×Y top copper electroplate, where Y is either 200 mm or 50 mm.
1×1×0.2 mm thin GaN LED on Silicon. The thermal properties of silicon were used. The silicon to copper solder was not added, because the thermal conductivity of the solder is about the same as that of the silicon.
The thermal load on the top of the LED was 1500 mW (assuming a 2 Watt LED with 25% external optical efficiency).

The thermal impedance, ° C./W, between the LED junction (where the LED attaches) and the copper plating on the bottom side of the dielectric layer is shown below in Table 1.

TABLE 1

| FIG. | Polyimide Thickness (mm) | Copper Thickness (μm) | ° C./W |
| --- | --- | --- | --- |
| 12A (comp.) | 47 | 50 | 20.7 |
| 12B (comp.) | 47 | 200 | 14.7 |
| 12C | 5 | 50 | 6.7 |
| 12D | 5 | 200 | 4.3 |

As can be seen, the flexible LESD devices of the present invention provide superior thermal properties compared to the comparative devices.

Example 5

Following is another example of packaging LESDs on a flexible substrate, specifically, mounting blue LEDs in cavities of a flexible dielectric layer using a solder reflow bonding method.

Figure 13:
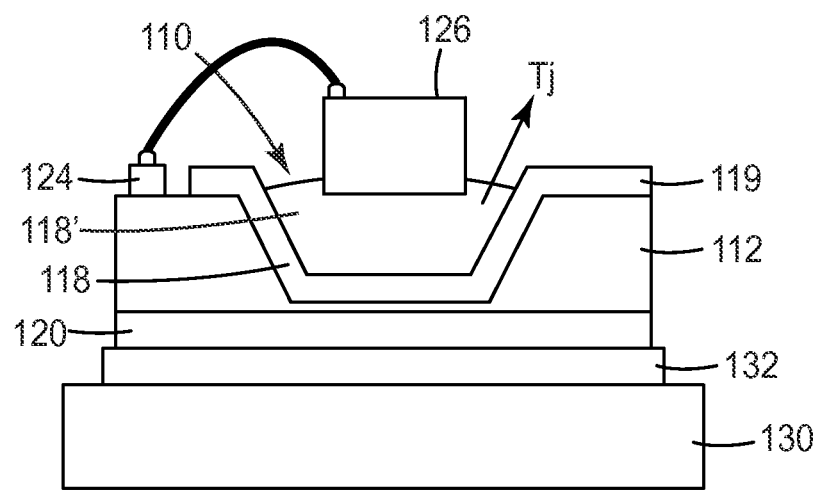
FIG. 13 depicts an embodiment of a flexible LESD of the present invention.

Referring to FIG. 13, conductive circuits 119, 120 were formed on, and a plurality of cavities 110 was formed in, a flexible dielectric layer 112 using the Circuit-Forming Method described above. Each cavity had a floor thickness of about 5 μm and a conductive coating 118 of electroplated copper of about 35 μm, resulting in a remaining cavity depth of about 10 μm. The cavity sizes varied from about 2×2 mm to about 6×6 mm (length×width), measured at the cavity floor. In each cavity, a Cree EZ 1000 LED 126, available as part number C460EZ1000-0118 from Cree, Inc., Durham, N.C., U.S.A., was physically and electrically bonded to the conductive coating 118 using a solder reflow bonding method, whereby a conductive material 118' comprising a lead-free tin-silver alloy 134 (96.5 Sn, 3.5 Ag), available from Cookson Electronics, Providence, R.I., U.S.A., was electroplated on top of the floor surface of the cavity, the LED was positioned on top of the tin-silver alloy plating, and the assembly was run through a solder reflow oven using process settings in accordance with industry standard JEDEC J-STD-020. Each LED had a size of about 980×980 µm (length×width) and a thickness of about 170 µm. It had two top contacts as the cathode and the bottom as the anode. The gold contacts pads had a size of about 150×150 µm (length×width) and the bottom anode, which is gold-tin at an 80:20 ratio, had a thickness of about 3 µm. The cathodes of each LED were wire bonded to the conductive circuit on the top surface of the dielectric layer through gold bonding pads 124 using a manual wire bonder, available under the trade designation 4524D from Kulicke and Soffa Industries, Inc., Fort Washington, Pa., U.S.A., with 1 mil diameter gold wire. The assembly was tested using a power supply available as model number EX4210R (voltage rating 42 V, current rating 10 A) from Thurlby Thandar Instruments Limited (TTi), Huntingdon, Cambridgeshire, United Kingdom. The LEDs were bright blue when lit up and the assembly showed flexibility.

Example 6

The following example describes temperature measurements of LEDs in cavities of different sizes using the structure of Example 5 attached to a secondary heat sink using a thermal tape.

Referring again to FIG. 13, a metal heat sink 130 having a size of about 101.6×101.6 mm (4×4 inch, length×width) and a thickness of about 10.06 mm (0.4 inch) was provided. A thermally conductive adhesive transfer tape 132, available under the trade designation 3M™ Thermally Conductive Adhesive Transfer Tape 8805 from 3M Company, St. Paul, Minn., U.S.A., was placed on the top surface of the aluminum heat sink. The flexible LED structure of Example 5 was placed on the transfer tape.

Table 2 shows the Infra red (IR) thermal imager based temperature measurements for LEDs in different cavities and biased at 1 Watt. The temperature is measured at the top surface of the circuit near to the floor area which is more often called the junction temperature and is denoted as Tj as shown in FIG. 13. The temperature imaging was carried out using a infra-red (IR) camera, available under the trade designation Fluke Ti32 from Fluke Corporation, Everett, Wash., U.S.A., using a background temperature of 25° C., with emissivity and transmission setting at 0.95 and 1.00 respectively. Using a wide lens the highest hot-spot was imaged on the floor cavity and its averaged temperature was referenced to the junction temperature. The LEDs were all biased at 1 Watt (350 mA, 3.5V).

TABLE 2

| Cavity Size (mm) | Tj (° C.) |
|---|---|
| 2 × 2 | 69.2 |
| 3 × 3 | 59.7 |
| 4 × 4 | 58.3 |
| 5 × 5 | 53.3 |

Example 7

The following example describes the thermal performance of the LEDs in cavities of different sizes determined by numerical modeling.

Figure 14:
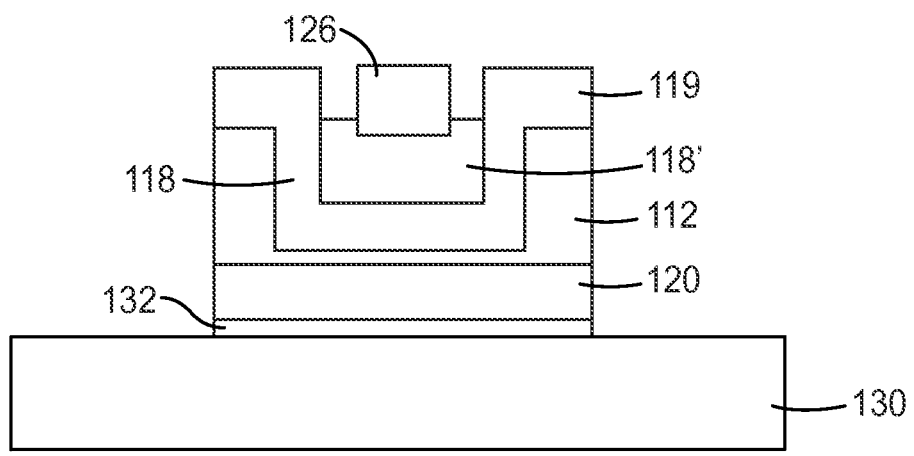
FIG. 14 depicts a schematic representation used for thermal modeling an embodiment of a flexible LESD of the present invention.

The model included LEDs in cavities of different sizes using a schematic representation, such as that illustrated in FIG. 14, of a structure corresponding to the structure of Example 6, wherein corresponding elements are identically numbered. For the numerical modeling of the thermal resistance of LEDs in cavities of different sizes, a computational fluid dynamics software, available under the trade designation Ansys Fluent from Ansys, Canonsburg, Pa., U.S.A., was used. A constant temperature of 25° C. boundary condition was applied to conductive circuit 120. For Tj modeling, a computational fluid dynamics software for electronics thermal management, available under the trade designation Ansys Icepak from Ansys, Canonsburg, Pa., U.S.A., was used. The model for Tj follows the IC package thermal characterization standard for natural convection, JEDEC EIA/JESD 51-X. A heat sink having a size of 101.6×101.6 mm (4×4 inch, length×width) and a thickness of 10.06 mm (0.4 inch) was used. An environment temperature of 25° C. and natural convection and radiation were assumed for the model boundary conditions.

Table 3 shows the predicted $\theta_{jc}$ (junction-to-case thermal resistance) for different configurations and 1 Watt heat dissipation from the LED. Tj is the junction temperature calculated at the center of the LED, as shown in FIG. 14. Larger cavity size, thicker top copper layer, and thinner bottom copper layer yields smaller $\theta_{jc}$. The trend of the numerical modeling results shown in Table 3 is consistent with the measurement results shown in Table 2.

TABLE 3

| Total Footprint (mm) | Cavity Size (mm) | Thermal Resistance (° C./W) | Tj (° C.) |
|---|---|---|---|
| 2.4 × 2.4 | 2 × 2 | 12.452 | 78.3 |
| 3.4 × 3.4 | 3 × 3 | 8.944 | 61.2 |
| 4.4 × 4.4 | 4 × 4 | 7.877 | 53.6 |
| 5.4 × 5.4 | 5 × 5 | 7.419 | 50.8 |

Example 8 and Comparative Example

The following example describes temperature measurements of a flexible LED structure according to an aspect of the present invention compared with a conventional packaged LED, both attached to a secondary heat sink using solder.

A flexible LED structure according to an aspect of the present invention was provided. The flexible LED structure included a flexible substrate having a length of about 4.2 mm, a width of about 4.2 mm, and a thickness of about 0.3 mm, representing a cavity according to an aspect of the present invention having a cavity size of about 4×4 mm (length×width). The flexible substrate included a copper-polyimide-copper (Cu-PI-Cu) layer structure, wherein the bottom (heat sink side) copper layer had a thickness of about 50 μm, the polyimide layer had a thickness of about 5 μm, and the top (LED side) copper layer had a thickness of about 70 μm. A Cree EZ700 LED, available as part number C460EZ700-S2400-2 from Cree, Inc., Durham, N.C., U.S.A., was bonded to the top copper layer of the flexible substrate, electrically connecting the anode of the LED to the flexible substrate, using a solder reflow bonding method, whereby a lead-free tin-silver alloy 134 (96.5 Sn, 3.5 Ag), available from Cookson Electronics, Providence, R.I., U.S.A., was electroplated on the top copper layer, the LED was positioned on top of the tin-silver alloy plating, and the assembly was run through a solder reflow oven using process settings in accordance with industry standard JEDEC J-STD-020. The LED had a size of about 680×680 μm (length×width) and a thickness of about 100 μm. It had one top contact as the cathode and the bottom as the anode. The gold contact pad had a size of about 130×130 μm (length×width) and the anode, which is gold-tin at an 80:20 ratio, had a thickness of about 3 μm. The LED was wire bonded to the conductive circuit on the top copper layer of the flexible substrate through gold bonding pads using a manual wire bonder, available under the trade designation 4524D from Kulicke and Soffa Industries, Inc., Fort Washington, Pa., U.S.A., with 1 mil diameter gold wire.

A conventional packaged LED was provided. The conventional packaged LED was a Cree XLamp XR-C packaged LED, available as part number XRCWHT-L1-0000-00xxx from Cree, Inc., Durham, N.C., U.S.A., which included a Cree EZ700 LED bonded onto a silicon substrate to form an LED subassembly, which was bonded onto a ceramic substrate. The ceramic substrate had a length of about 9 mm, a width of about 7 mm, and a thickness of about 1.3 mm. The ceramic substrate included a copper-aluminum nitride-copper (Cu—AlN—Cu) layer structure, wherein the bottom (heat sink side) copper layer had a thickness of about 75 μm, the aluminum nitride layer had a thickness of about 600 μm, and the top (LED side) copper layer had a thickness of about 75 μm. The LED subassembly was bonded to the ceramic substrate, electrically connecting the anode of the LED to the ceramic substrate. The LED had a size of about 680×680 μm (length×width) and a thickness of about 100 μm. It had one top contact as the cathode and the bottom as the anode. The gold contact pad had a size of about 130×130 μm (length×width) and the anode, which is gold-tin at an 80:20 ratio, had a thickness of about 3 μm. The LED was wire bonded to the conductive circuit on the top copper layer of the ceramic substrate through gold bonding pads using a manual wire bonder, available under the trade designation 4524D from Kulicke and Soffa Industries, Inc., Fort Washington, Pa., U.S.A., with 1 mil diameter gold wire. To make sure the temperature readings were the comparable, the lens, its mounting, and the phosphor layer were carefully removed from the packaged LED. The lens and mounting were removed by mechanical force using a razor blade by gently forcing through the interface of the mounting and the substrate by intermediate greasing with organic solvent. The phosphor layer was removed by soaking in organic solvent and after a few minutes the layer was detached by scraping with a thin razor blade without destroying the LED contacts.

Both the flexible LED structure according to an aspect of the present invention and the conventional packaged LED were bonded to a heat sink, using soldering iron technology. The heat sink was a thermal clad substrate, available as STAR Board 803122 from The Bergquist Company, Chanhassen, Minn., U.S.A. The heat sink had a length of about 19.9 mm, a width of about 19 mm, and a thickness of about 1.6 mm.

Table 4 shows the infrared (IR) thermal imager based temperature measurements for the LEDs biased at 1 Watt (350 mA, 3.5V). Temperature Tj was measured at the top, light emitting surface of the LED. Temperature Ta was measured on the bottom (opposite LED side) of the heat sink. The temperature imaging was carried out using a infrared (IR) camera, available under the trade designation Fluke Ti32 from Fluke Corporation, Everett, Wash., U.S.A., using a background temperature of 25° C., with emissivity and transmission setting at 0.95 and 1.00 respectively. The results illustrate that the flexible LED structure according to an aspect of the present invention (Sample 1) and the conventional packaged LED (Sample C1) have a similar thermal performance. However, the flexible LED structure according to an aspect of the present invention is thinner, more flexible, less expensive, lighter in weight, and has a shorter thermal path and a smaller coefficient of thermal expansion (CTE) than the conventional packaged LED.

TABLE 4

|  | Substrate | Tj (° C.) | Ta (° C.) |
| --- | --- | --- | --- |
| Example 8 | Flexible | 52.8 | 32.6 |
| Comparative Example C1 | Ceramic | 52.7 | 33.5 |

Additional embodiments of the present invention include:

Embodiment 1: A flexible article comprising:
- a flexible polymeric dielectric layer having first and second major surfaces, the first surface having a first conductive layer thereon and having at least one cavity therein, the second major surface optionally having a second conductive layer thereon, the at least one cavity defined by one or more walls and a floor, the at least one cavity having a third conductive layer on at least a portion of its walls and floor; the third conductive layer configured to directly or indirectly support a light emitting semiconductor device,
- wherein the first conductive layer is electrically conductive and the second and third conductive layers are thermally conductive, and
- wherein there is no direct connection between the second major surface of the dielectric layer and the third conductive layer.

Embodiment 2. The article of embodiment 1 wherein the dielectric layer has an array of cavities.

Embodiment 3. The article of embodiments 1 or 2 wherein a light emitting semiconductor device is directly or indirectly bonded to the conductive layer or material in the at least one cavity.

Embodiment 4. The article of any one of embodiments 1 to 3 wherein a light emitting semiconductor device is wire bonded to the first conductive layer.

Embodiment 5. The article of any one of embodiments 1 to 4 wherein the dielectric layer comprises a polyimide core and thermoplastic polyimide layers on one or both sides of the core.

Embodiment 6. The article of any one of embodiments 1 to 5 wherein the top surface of the at least one cavity is reflective.

Embodiment 7. The article of embodiment 6 wherein the top surface of the at least one cavity comprises a reflective material applied over at least a portion of the conductive layer in the cavity.

Embodiment 8. The article of embodiment 7 wherein the reflective material is selected from the group consisting of gold, silver, aluminum with enhanced reflectivity, an inherently reflective dielectric material, and a pigmented material.

Embodiment 9. The article of embodiment 7 further comprising a passivation layer between the reflective material and the light emitting semiconductor device in the at least one cavity.

Embodiment 10. The article of embodiment 9 wherein the passivation layer comprises gold:tin and the reflective layer comprises gold.

Embodiment 11. The article of any one of embodiments 1 to 10 wherein the at least one cavity is filled with phosphor-filled encapsulant.

Embodiment 12. A method comprising:
providing a flexible dielectric layer having first and second major surfaces;
creating a conductive layer on the first major surface of the dielectric layer;
creating at least one cavity in the first major surface of the dielectric layer;
applying a conductive layer in the at least one cavity;
bonding a light emitting semiconductor device directly or indirectly to the conductive material in the at least one cavity.

Embodiment 13. The method of embodiment 12 further comprising bonding a light emitting semiconductor device directly or indirectly to the conductive layer in the at least one cavity; and electrically connecting the light emitting semiconductor device to the conductive layer on the first major surface of the dielectric layer.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. A flexible article comprising:
a flexible polymeric dielectric layer having first and second major surfaces, the first surface having a first conductive layer thereon and having at least one cavity therein, the second major surface optionally having a second conductive layer thereon, the at least one cavity defined by one or more walls and a floor, the at least one cavity having a third conductive layer on at least a portion of its walls and floor; the third conductive layer configured to directly or indirectly support a light emitting semiconductor device,
wherein the at least one cavity contains an additional conducive material disposed on the third conductive layer, the combination of the additional conductive material and the third conductive layer having a thickness of at least 25 percent of a cavity depth of the at least one cavity,
wherein the first conductive layer is electrically conductive and the second and third conductive layers are thermally conductive, and
wherein there is no direct connection between the second major surface of the dielectric layer and the third conductive layer.

2. The article of claim 1 wherein the third conductive layer is electrically conductive and is electrically connected to the first conductive layer.

3. The article of claim 1 wherein the first electrically conductive layer comprises a circuit.

4. The article of claim 1 wherein the second major surface has a second conductive layer thereon.

5. The article of claim 4 wherein the second conductive layer is electrically conductive and comprises an electrical circuit.

6. The article of claim 4 wherein the second conductive layer comprises a thermally conductive adhesive.

7. The article of claim 1 wherein the first major surface of the dielectric layer has an array of cavities therein and at least a portion of the cavities are configured to support light emitting semiconductor devices.

8. The article of claim 1 wherein the cavity floor is comprised of a portion of the dielectric layer.

9. The article of claim 1 wherein the cavity floor is comprised of a dielectric material different from the dielectric layer material.

10. The article of claim 1 wherein the distance between the cavity floor and the second major surface is about 5% to about 75% of the thickness of the dielectric layer.

11. The article of claim 1 wherein the distance between the cavity floor and the second major surface is about 5% to about 60% of the thickness of the dielectric layer.

12. The article of claim 1 wherein the at least one cavity has walls that slope from the first major surface to the cavity floor at an angle of about 5° to about 60° as measured from the major plane of the dielectric layer.

13. The article of claim 1 wherein a light emitting semiconductor device is supported by the third conductive layer in the cavity and is selected from the group consisting of a bare die LES construction, an intermediate LES construction, and a complete packaged LES construction.

14. The article of claim 1 wherein the ratio of the footprint area of the light emitting semiconductor device to the area of the cavity floor is about 1:2 to about 1:4.

15. The article of claim 1 wherein the ratio of the footprint area of the light emitting semiconductor device to the area of the cavity floor is about 1:3.

16. The article of claim 1 wherein the combination of the third conductive layer and the additional conductive material in the cavity has a thickness of about 50 micrometers to about 100 micrometers.

17. The article of claim 1 wherein the cavity has an upper portion near the first major surface of the dielectric layer and a lower portion near the second major surface of the dielectric layer and wherein the diameter of the upper portion is greater than the diameter of the lower portion.

18. The article of claim 1 further comprising a second polymeric dielectric layer on the first conductive layer, the second polymeric dielectric layer having an opening extending therethrough such that the opening forms an upper portion of the cavity.

* * * * *

UNITED STATES PATENT AND TRADEMARK OFFICE
CERTIFICATE OF CORRECTION

PATENT NO. : 9,698,563 B2
APPLICATION NO. : 13/883354
DATED : July 4, 2017
INVENTOR(S) : Ravi Palaniswamy Page 1 of 1

It is certified that error appears in the above-identified patent and that said Letters Patent is hereby corrected as shown below:

In the Specification

Column 14
Line 45; Delete "lam" and insert -- µm --, therefor.
Line 52; Delete "lam" and insert -- µm --, therefor.

Signed and Sealed this
Nineteenth Day of June, 2018

Andrei Iancu
*Director of the United States Patent and Trademark Office*